United States Patent
Jung

(10) Patent No.: US 7,384,874 B2
(45) Date of Patent: Jun. 10, 2008

(54) METHOD OF FORMING HARDMASK PATTERN OF SEMICONDUCTOR DEVICE

(75) Inventor: Woo Yung Jung, Seoul (KR)

(73) Assignee: Hynix Semiconductor, Icheon-si (KR)

( * ) Notice: Subject to any disclaimer, the term of this patent is extended or adjusted under 35 U.S.C. 154(b) by 34 days.

(21) Appl. No.: 11/618,771

(22) Filed: Dec. 30, 2006

(65) Prior Publication Data
US 2008/0081412 A1    Apr. 3, 2008

(30) Foreign Application Priority Data
Sep. 29, 2006 (KR) .................. 10-2006-0095993
Dec. 15, 2006 (KR) .................. 10-2006-0128767

(51) Int. Cl.
*H01L 21/311* (2006.01)
(52) U.S. Cl. .................. 438/700; 438/717; 438/942; 438/950; 257/E21.023; 257/E21.231
(58) Field of Classification Search .......... 438/671, 438/950; 257/E21.023, E21.221, E21.249, 257/E21.254
See application file for complete search history.

(56) References Cited
U.S. PATENT DOCUMENTS
7,151,040 B2 * 12/2006 Tran et al. .................. 438/401

2007/0249174 A1 * 10/2007 Yang .......................... 438/712

* cited by examiner

*Primary Examiner*—Michael S. Lebentritt
*Assistant Examiner*—Cheung Lee
(74) *Attorney, Agent, or Firm*—Townsend and Townsend and Crew LLP

(57) ABSTRACT

A method of forming a hardmask pattern over a semiconductor device semiconductor device includes forming a first hardmask layer over a semiconductor substrate. First and second structures are formed over the first hardmask layer, the first and second structures formed of the same material, the first and second structures defining a first pitch. First and second overcoats are formed over the first and second structures, respectively, the first and second overcoats being conformal to the first and second structures, respectively. The first and second overcoats define a space therebetween and are configured to expose an underlying layer. A filling layer is formed to fill the space defined between the first and second overcoats. The first and second overcoats are removed to provide the first structure, the second structure, and a third structure provided between the first and second structures, the first and third structures defining a second pitch, the second and third structures defining a third pitch. The first hardmask layer is etched using the first, second, and third structures to obtain first, second, and third hardmask patterns, respectively.

18 Claims, 4 Drawing Sheets

METHOD OF FORMING HARDMASK PATTERN OF SEMICONDUCTOR DEVICE

CROSS-REFERENCES TO RELATED APPLICATIONS

The present application claims priority to Korean patent application number 10-2006-95993 filed on Sep. 29, 2006 and Korean patent application number 10-2006-128767 filed on Dec. 15, 2006, which are incorporated by reference in its entirety.

BACKGROUND OF THE INVENTION

The present invention relates to a method of manufacturing a semiconductor device and, more particularly, to a method of forming a hardmask pattern in which the pitch of a pattern is less than the resolution of the exposure equipment used.

The smallest pitch of a pattern formed in a photolithography process is varied depending on the wavelength of exposure light used in the exposure equipment. As the level of integration of semiconductor devices is accelerated, light with a wavelength shorter than what is being used now must be used to decrease the pitch of the pattern. To this end, X-ray or e-beam may be used, but this is still in the experimental stage due to technical problems, productivity, and so on. Accordingly, a Double Exposure and Etch Technology (DEET) has been proposed.

FIGS. 1A to 1C are views illustrating a conventional double exposure etch technique.

Referring to FIG. 1A, a first photoresist PR1 is coated over an etch target layer 11 and a semiconductor substrate 10. After the first photoresist PR1 is patterned by exposure and development processes, the etch target layer 11 is etched using the patterned first photoresist PR1 as a mask. At this point, the etched etch target layer 11 has a line width of 150 nm and a space width of 50 nm.

The first photoresist PR1 is removed. A second photoresist PR2 is coated over the entire surface. As illustrated in FIG. 1B, the second photoresist PR2 is patterned by exposure and development processes so that parts of the etch target layer 11 is exposed.

The etch target layer 11 is etched again by using the patterned second photoresist PR2 as a mask, thus forming a pattern having a line and space width of 50 nm, as illustrated in FIG. 1C. The second photoresist PR2 is then removed.

In the DEET, overlay accuracy during the exposure process of the second photoresist PR2 is directly connected to a Critical Dimension (CD) variation of the final pattern. In reality, overlay accuracy of the exposure equipment is difficult to control below 10 nm, thus making it difficult to decrease CD variation of the final pattern. Furthermore, there is a difficulty in controlling circuit separation through Optical Proximity Correction (OPC) over the double exposure.

BRIEF SUMMARY OF THE INVENTION

An embodiment of the present invention is directed towards a method of forming a hardmask pattern of a semiconductor device, in which the pitch of the pattern is less than the resolution of the exposure equipment used.

In one embodiment, a method of forming a hardmask pattern of a semiconductor device includes the steps of; forming a first hardmask layer and a second hardmask layer on a semiconductor substrate in which an etch subject layer is formed; forming first patterns over the second hardmask layer; forming a spacer over a surface of the first patterns; forming second patterns between the first patterns in which the spacer is formed; removing the spacer; and etching the second hardmask layer and the first hardmask layer by an etch process using the first patterns and the second patterns as etch masks, thereby forming hardmask patterns.

In one embodiment, a method of forming a hardmask pattern over a semiconductor device semiconductor device includes forming a first hardmask layer and a second hardmask layer over a semiconductor substrate; forming first and second patterns of a first type over the second hardmask layer; forming first and second overcoats over the first and second patterns of the first type, respectively, the first and second overcoats being conformal to the corresponding patterns of the first type, the first and second overcoats defining a space therebetween and configured to expose an underlying layer; forming a filling layer to fill the space defined between the first and second overcoats; removing the first and second overcoats to provide the first pattern of the first type, the second pattern of the first type, and an additional pattern provided between the first and second patterns of the first type; and etching the second hardmask layer and the first hardmask layer using the first pattern of the first type, the second pattern of the first type, and the additional pattern to obtain hardmask patterns.

In another embodiment, a method of forming a hardmask pattern over a semiconductor device semiconductor device includes forming a first hardmask layer over a semiconductor substrate. First and second structures are formed over the first hardmask layer, the first and second structures formed of the same material, the first and second structures defining a first pitch. First and second overcoats are formed over the first and second structures, respectively, the first and second overcoats being conformal to the first and second structures, respectively. The first and second overcoats define a space therebetween and are configured to expose an underlying layer. A filling layer is formed to fill the space defined between the first and second overcoats. The first and second overcoats are removed to provide the first structure, the second structure, and a third structure provided between the first and second structures, the first and third structures defining a second pitch, the second and third structures defining a third pitch. The first hardmask layer is etched using the first, second, and third structures to obtain first, second, and third hardmask patterns, respectively.

In another embodiment, the method further comprises providing a second hardmask layer below the first hardmask layer, wherein the etching step involves etching the first and second hardmask layers to obtain the first, second, and third hardmask layers, each hardmask layer including the first and second hardmask layers.

In another embodiment, the substrate defines a dense region and an isolated region, the dense region having more transistors per area than the isolated region. The method further comprises providing a pattern over the filling region, wherein the pattern covers in the dense region and exposes the isolated region, so that a portion the filling layer that is provided in the isolated region is exposed; and removing the exposed filling layer in the isolated region while leaving the filling layer in the dense region intact. The filling layer includes spin on glass. The pattern is a photoresist pattern. The pattern and the first and second overcoats are removed using the same process.

In another embodiment, the first pitch is greater than the second pitch or the third pitch, the second and third pitch being substantially the same. The second or third pitch has a dimension that is less than the maximum resolution of an exposure apparatus used to form the first and second structures.

DESCRIPTION OF SPECIFIC EMBODIMENTS

A specific embodiment according to the present patent will be described with reference to the accompanying drawings.

Figure 1A:
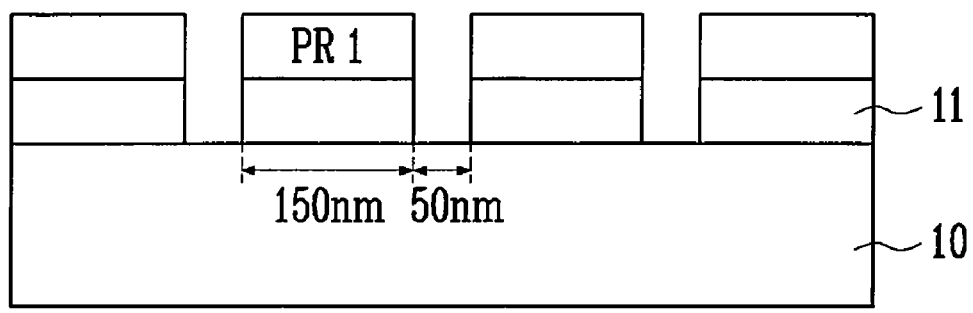
FIGS. 1A to 1C are views illustrating a conventional dual exposure etch technique.
Figure 1B:
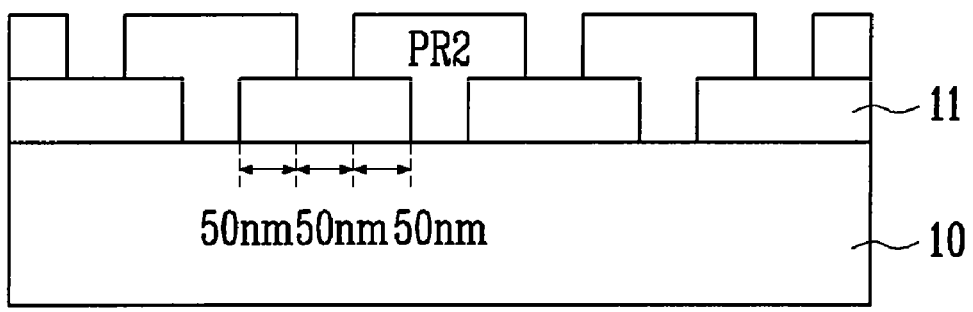
Figure 1C:
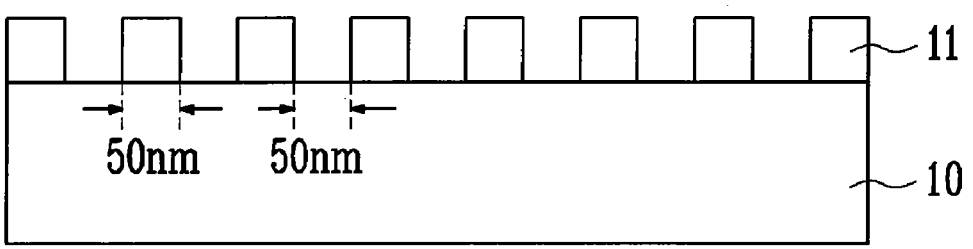
Figure 2:
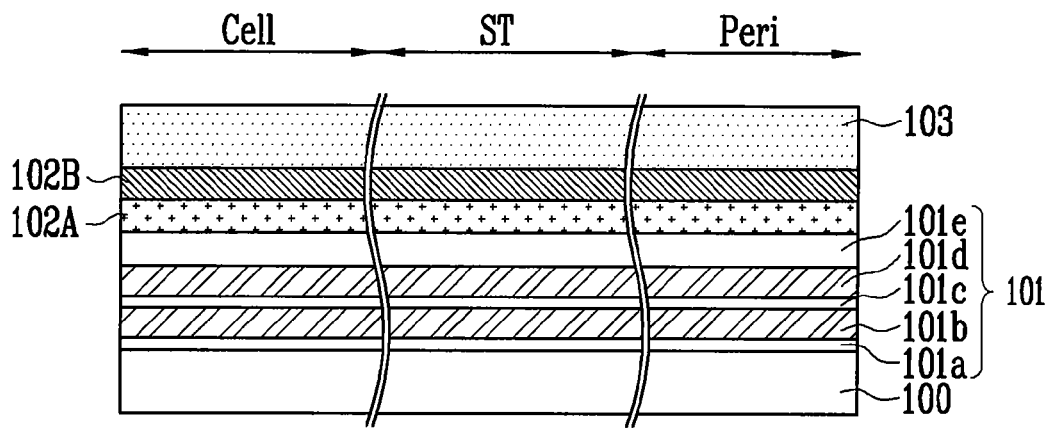
FIGS. 2 to 9 are cross-sectional views illustrating a method of forming a hardmask pattern of a semiconductor device according to an embodiment of the present invention.

Referring to FIG. 2, a semiconductor substrate 10 contains a memory cell region Cell, a select transistor region ST and a peripheral region Peri. The memory cell region Cell is where cell transistors are formed. The select transistor region ST contains the Drain Select Line (DSL) and the Source Select Line (SSL). The peripheral region Peri contains the peripheral circuits.

An etch target layer 101 is formed over the semiconductor substrate 100. The etch target layer 101 includes a tunnel layer 101a, a conductive layer 101b for a floating gate, a dielectric layer 101c, a conductive layer 101d for a control gate, and a insulating layer 101e. The present embodiment is illustrated by using a process wherein hardmask patterns are used to form the gate patterns of the memory cells and transistors. A first hardmask layer 102A is formed over the etch target layer 101. The first hardmask layer 102A includes amorphous carbon.

A second hardmask layer 102B is formed over the first hardmask layer 102A. The second hardmask layer 102B includes SiON or nitride. A polysilicon layer 103 is then formed over the second hardmask 102B.

Figure 3:
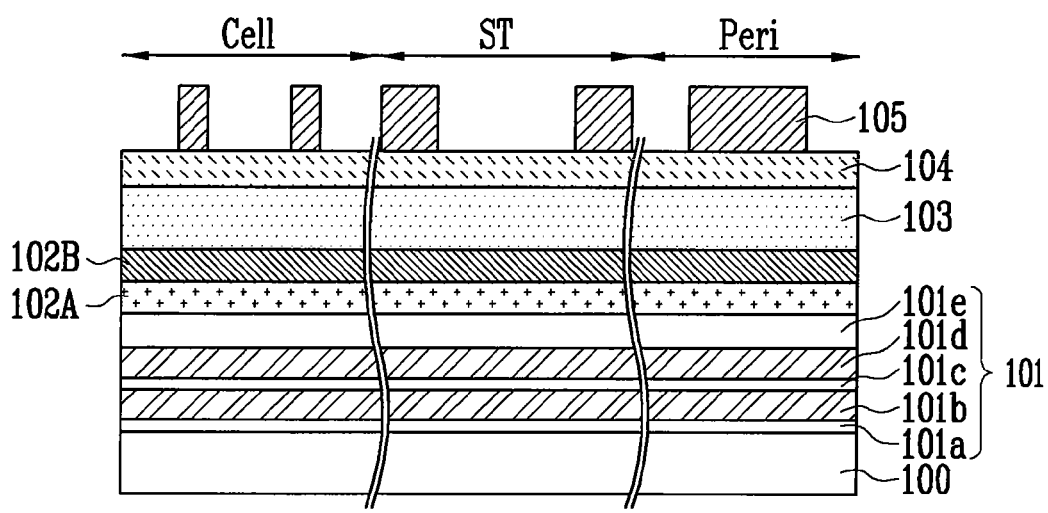

Referring to FIG. 3, a Bottom Anti-Reflective Coating (BARC) layer 104 is formed over the polysilicon layer 103. After a photoresist is coated over the BARC layer 104, exposure and development processes are performed to form the first photoresist patterns 105.

Figure 4:
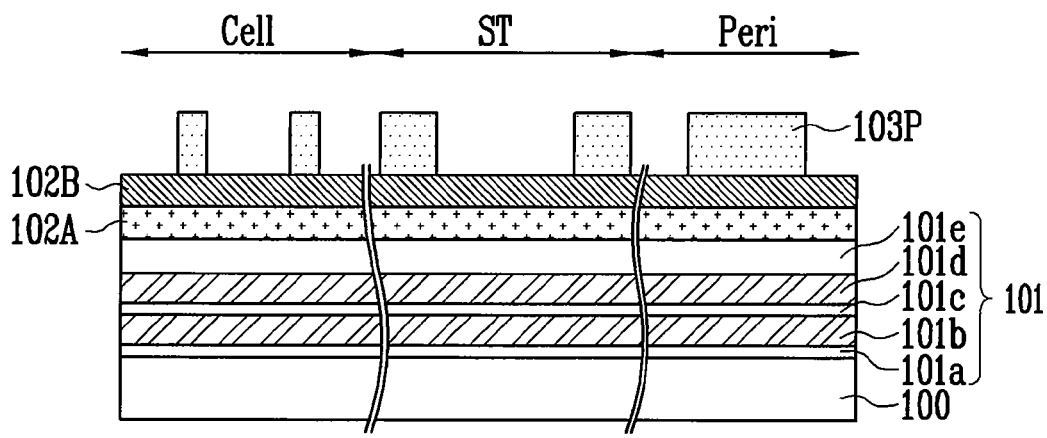

Referring to FIG. 4, an etch process using the first photoresist patterns 105 as a mask is performed to etch the BARC layer 104 and the polysilicon layer 103 so that the second hardmask layer 102B is exposed. This forms polysilicon patterns 103P from the polysilicon layer 103. The first photoresist patterns 105 and BARC layer 104 are removed by a strip process.

Figure 5:
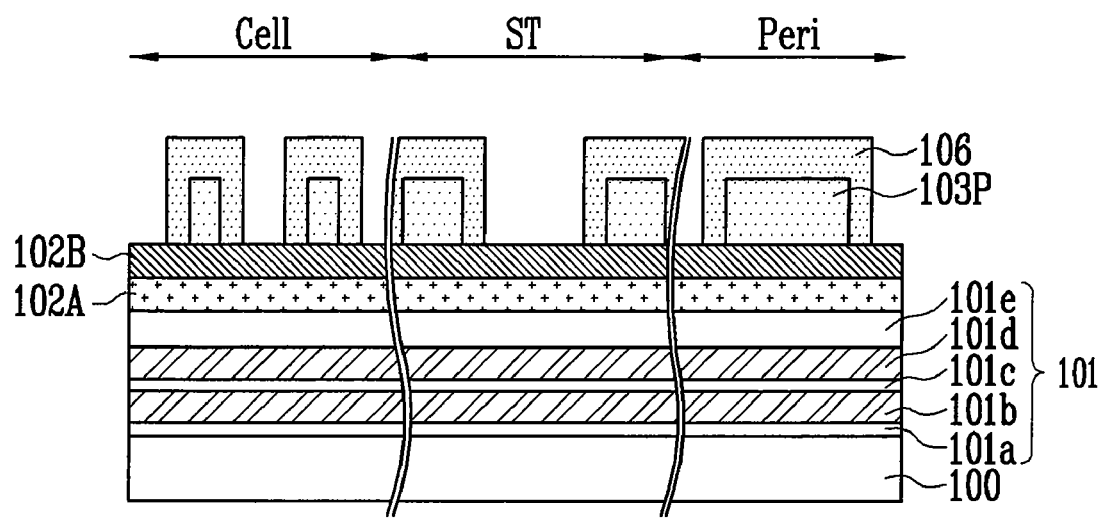

Referring to FIG. 5, an overcoat 106 is formed on sidewalls and top of the polysilicon patterns 103P. The overcoat 106 is formed from amorphous carbon. The overcoat 106 can be formed by performing a pre-treatment process for 30 to 70 seconds, performing a glue layer deposition process for 5 to 15 seconds, and performing a fluorocarbon polymer process at least once for 2 to 10 seconds. In this case, time taken to perform the process can be decided depending on a thickness of the overcoat 106. After the pre-treatment process, the glue layer deposition process and the fluorocarbon polymer process are carried out, a polymer break-through process may be further performed. The polymer break-through process can be performed when it is necessary to make better the profile of the overcoat 106 or when neighboring overcoats 106 are connected. If the overcoat 106 is formed by the above method, the overcoat is formed to be conformal to the polysilicon patterns 103P and is provided with a substantially constant thickness. Thus, the sidewalls of the overcoat 106 are substantially vertical.

Figure 6:
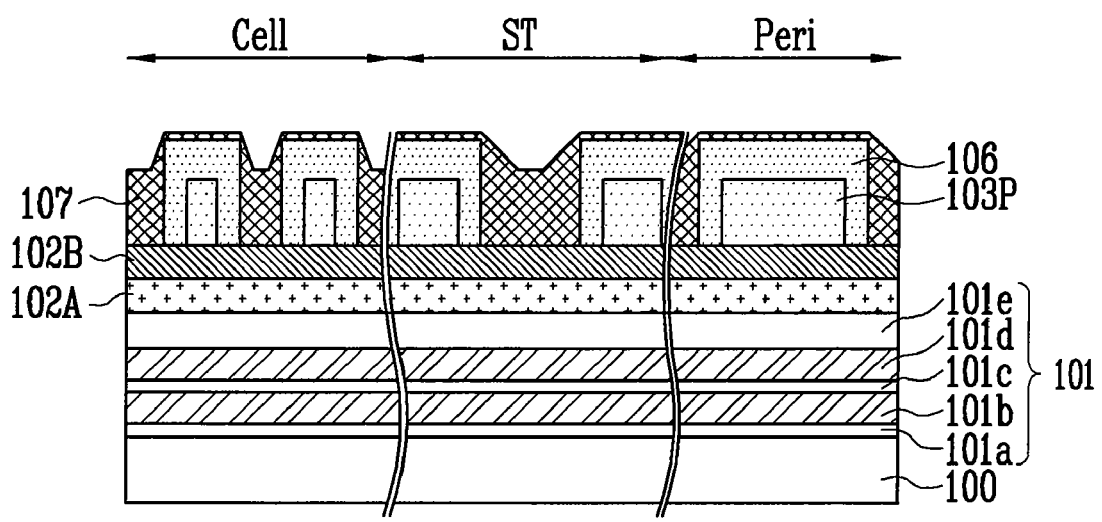

Referring to FIG. 6, a Spin-On-Glass (SOG) layer 107 is formed over the surface including the overcoats 106. The SOG layer 107 fills the space between the overcoats 106 surrounding the polysilicon patterns 103P.

Figure 7:
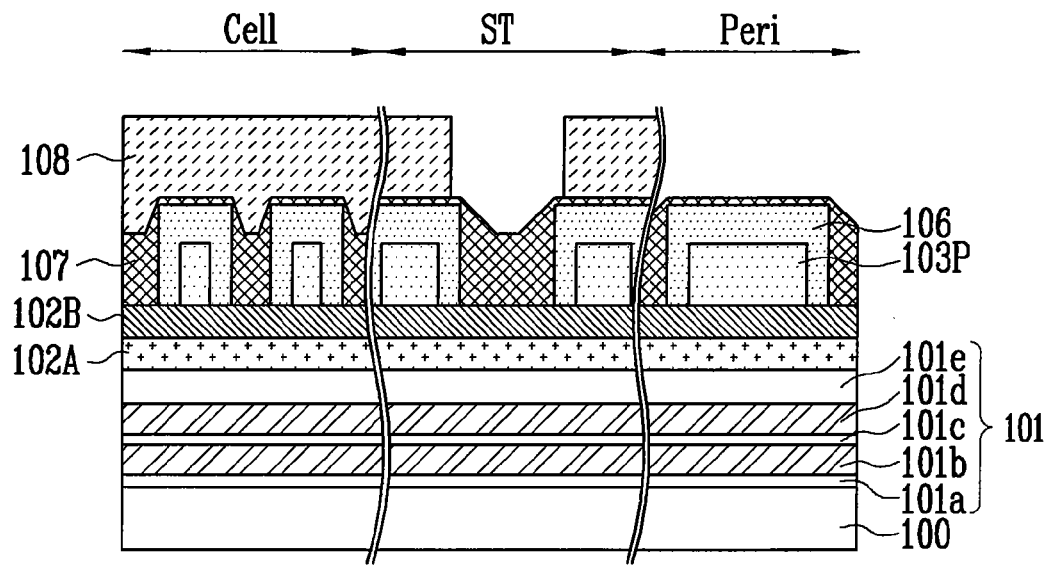

Referring to FIG. 7, a second photoresist pattern 108 is formed over the SOG layer 107 in order to retain the SOG layer 107 in the memory cell region Cell in which gate patterns will be formed densely and remove the SOG layer 107 in the other regions (e.g., ST and Peri) in which gate patterns will be not formed densely.

The SOG layer 107 formed over the select transistor region ST and the peripheral region Peri are removed by an etch process employing the second photoresist pattern 108. Before the second photoresist pattern 108 is formed, a BARC layer may be formed in order to prevent diffused reflection of the exposure process for forming the second photoresist pattern 108. It is preferred that the SOG layer 107 be removed by a wet etch process. If the SOG layer 107 is removed by a dry etch process, the second hardmask layer 102B may be deposited using nitride (SiN) instead of oxygen-doped nitride (SiON) in order to improve the etch selectivity with the second hardmask layer 102B.

Figure 8:
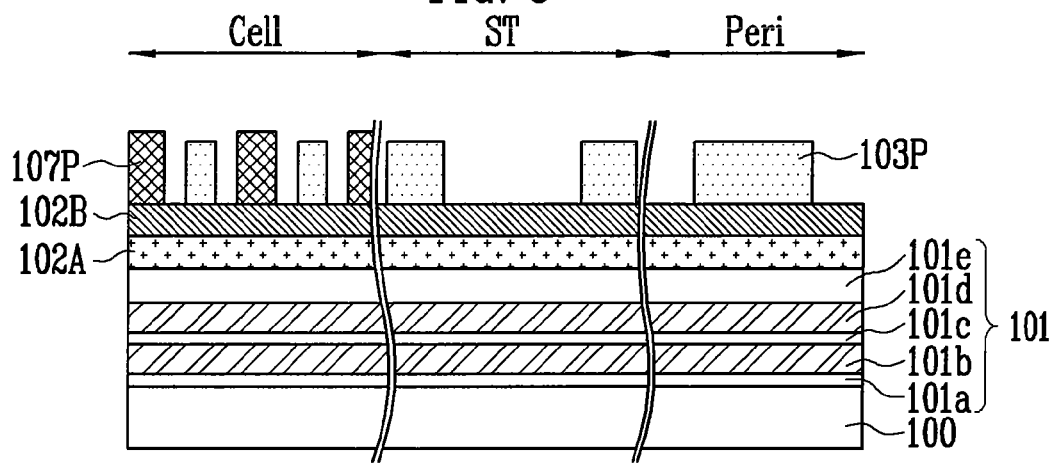

Referring to FIG. 8, the second photoresist pattern 108 is removed. SOG patterns 107P are formed at memory cell region Cell in which gate patterns will be formed densely. The second photoresist pattern 108 may be removed using $O_2$ plasma. The overcoat 106 is also removed at the same time in the present implementation. Thus, since an additional process for removing the overcoat 106 is not required, the process time can be shortened and cost can be saved.

Figure 9:
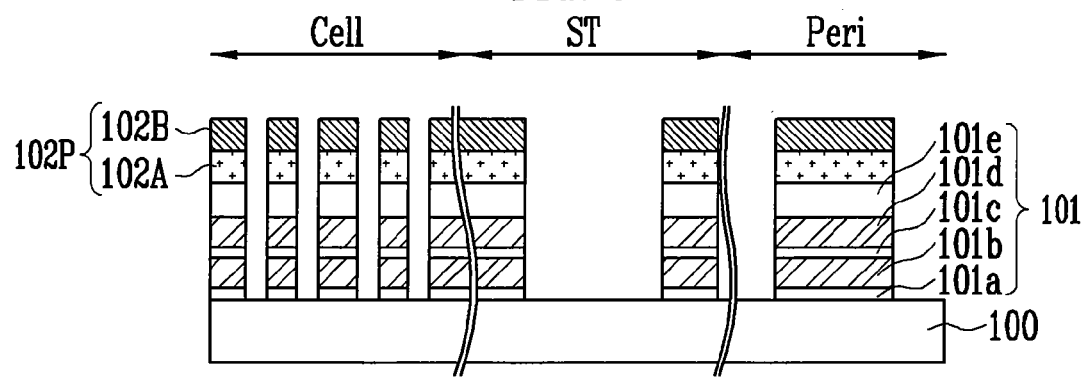

Referring to FIG. 9, the second hardmask layer 102B and the first hardmask layer 102A are sequentially etched by an etch process employing the polysilicon patterns 103P and the SOG patterns 107P as etch masks. The polysilicon patterns 103P and the SOG patterns 107P are removed. Hard mask patterns 102P including the first and second hardmasks are formed. The etch target layer 101 is etched by employing the hardmask patterns 102P to form the gate patterns at the memory cell region Cell, the select transistor region ST and the peripheral region Peri.

The present invention has been described above in context of performing a gate etch process in the flash memory device. However, the present invention may be applied to other types of etch processes, e.g., an isolation trench etch process and a contact etch process. The present invention can also be applied to various semiconductor devices, e.g., DRAM, SRAM, NAND flash memory, or NOR flash memory.

As described above, according to the present invention, first patterns are formed using a photoresist pattern by means of an exposure process, overcoats (or spacers) are formed over sidewalls of the first patterns using a amorphous carbon, and space between the first patterns are filled, thus forming second hardmask patterns. Accordingly, a mask having a pitch less than the resolution of the exposure equipment can be formed.

Furthermore, a cell pattern having a dense pattern and sensitive overlay accuracy can be formed by a single exposure process and not a double exposure process. It is therefore possible to prevent a pattern size variation incurred by the short overlay margin of a double exposure process.

Also, since the spacer is formed using amorphous carbon, the number of process steps can be reduced, a process time can be shortened, and cost can be saved.

The above embodiments of the present invention are illustrative and not limitative. Various alternatives and equivalents are possible. Other additions, subtractions, or modifications are obvious in view of the present disclosure and are intended to fall within the scope of the appended claims.

What is claimed is:

1. A method of forming a hardmask pattern over a semiconductor device semiconductor device, the method comprising:
   forming a first hardmask layer and a second hardmask layer over a semiconductor substrate;
   forming first and second patterns of a first type over the second hardmask layer;
   forming first and second overcoats over the first and second patterns of the first type, respectively, the first and second overcoats being conformal to the corresponding patterns of the first type, the first and second overcoats defining a space therebetween and configured to expose an underlying layer;
   forming a filling layer to fill the space defined between the first and second overcoats;
   removing the first and second overcoats to provide the first pattern of the first type, the second pattern of the first type, and an additional pattern provided between the first and second patterns of the first type; and
   etching the second hardmask layer and the first hardmask layer using the first pattern of the first type, the second pattern of the first type, and the additional pattern to obtain hardmask patterns.

2. The method of claim 1, wherein the substrate defines a dense region and an isolated region, the dense region having more transistors per area than the isolated region, the method further comprising:
   providing a pattern of a second type over the filling region, wherein the pattern of the second type covers in the dense region and exposes the isolated region, so that a portion the filling layer that is provided in the isolated region is exposed; and
   removing the exposed filling layer in the isolated region while leaving the filling layer in the dense region intact.

3. The method of claim 2, further comprising:
   removing the pattern of the second type, wherein the first and second overcoats are removed using the same process to remove the pattern of the second type.

4. The method of claim 1, wherein the first and second overcoats are formed using amorphous carbon.

5. The method of claim 1, wherein the first and second overcoats are configured to have substantially the same thickness.

6. The method of claim 1, wherein the first hardmask layer is formed from amorphous carbon.

7. The method of claim 1, wherein the second hardmask layer is formed from SiON.

8. The method of claim 1, wherein the second hardmask layer is formed from nitride.

9. The method of claim 1, wherein the first and second patterns of the first type are formed from polysilicon, wherein the underlying layer is the second hardmask layer.

10. The method of claim 1, wherein the filling layer is formed from spin on glass (SOG).

11. A method of forming a hardmask pattern over a semiconductor device semiconductor device, the method comprising:
    forming a first hardmask layer over a semiconductor substrate;
    forming first and second structures over the first hardmask layer, the first and second structures formed of the same material, the first and second structures defining a first pitch;
    forming first and second overcoats over the first and second structures, respectively, the first and second overcoats being conformal to the first and second structures, respectively, the first and second overcoats defining a space therebetween and configured to expose an underlying layer;
    forming a filling layer to fill the space defined between the first and second overcoats;
    removing the first and second overcoats to provide the first structure, the second structure, and a third structure provided between the first and second structures, the first and third structures defining a second pitch, the second and third structures defining a third pitch; and
    etching the first hardmask layer using the first, second, and third structures to obtain first, second, and third hardmask patterns, respectively.

12. The method of claim 11, further comprising:
    providing a second hardmask layer below the first hardmask layer, wherein the etching step involves etching the first and second hardmask layers to obtain the first, second, and third hardmask layers, each hardmask layer including the first and second hardmask layers.

13. The method of claim 11, wherein the substrate defines a dense region and an isolated region, the dense region having more transistors per area than the isolated region, the method further comprising:
    providing a pattern over the filling region, wherein the pattern covers in the dense region and exposes the isolated region, so that a portion the filling layer that is provided in the isolated region is exposed; and
    removing the exposed filling layer in the isolated region while leaving the filling layer in the dense region intact.

14. The method of claim 13, wherein the filling layer includes spin on glass.

15. The method of claim 14, wherein the pattern is a photoresist pattern.

16. The method of claim 15, wherein the pattern and the first and second overcoats are removed using the same process.

17. The method of claim 11, wherein the first pitch is greater than the second pitch or the third pitch, the second and third pitch being substantially the same.

18. The method of claim 17, wherein the second or third pitch has a dimension that is less than the maximum resolution of an exposure apparatus used to form the first and second structures.

* * * * *